United States Patent
Kwon

(10) Patent No.: US 11,908,726 B2
(45) Date of Patent: Feb. 20, 2024

(54) METHOD OF MANUFACTURING ELECTROSTATIC CHUCK HAVING ELECTRODE LAYER MADE OF HETEROGENEOUS COMPOSITE MATERIAL, AND ELECTROSTATIC CHUCK MANUFACTURED THEREBY

(71) Applicant: PUKYONG NATIONAL UNIVERSITY INDUSTRY-UNIVERSITY COOPERATION FOUNDATION, Busan (KR)

(72) Inventor: Hansang Kwon, Busan (KR)

(73) Assignee: Pukyong National University Industry-University Cooperation Foundation, Busan (KR)

(*) Notice: Subject to any disclaimer, the term of this patent is extended or adjusted under 35 U.S.C. 154(b) by 0 days.

(21) Appl. No.: 17/732,968

(22) Filed: Apr. 29, 2022

(65) Prior Publication Data

US 2022/0359256 A1 Nov. 10, 2022

(30) Foreign Application Priority Data

May 10, 2021 (KR) .................. 10-2021-0060215

(51) Int. Cl.
*H01L 21/683* (2006.01)
*B22F 3/105* (2006.01)
(Continued)

(52) U.S. Cl.
CPC .......... *H01L 21/6833* (2013.01); *B22F 3/105* (2013.01); *B22F 3/24* (2013.01);
(Continued)

(58) Field of Classification Search
CPC ... C22C 2026/002; C22C 38/105; C23C 4/11; C23C 4/134; H01L 21/6833
See application file for complete search history.

(56) References Cited

U.S. PATENT DOCUMENTS 6,122,159 A 9/2000 Arai et al.
10,196,757 B1 * 2/2019 Chen .................... D01D 5/0061
(Continued)

FOREIGN PATENT DOCUMENTS

DE 102012210023 A1 * 12/2013 ............. G01L 19/04
JP 11-168134 A 6/1999
(Continued)

OTHER PUBLICATIONS

Kim et al., "Carbon nanotubes-reinforced aluminum alloy functionally graded matrials fabricated by powder extrusion process" Materials Science and Engineering: A 745, (2019), pp. 379-389.
(Continued)

*Primary Examiner* — Sally A Merkling
*Assistant Examiner* — Sean P. O'Keefe
(74) *Attorney, Agent, or Firm* — Knobbe, Martens, Olson & Bear, LLP

(57) ABSTRACT

This application relates to a method of manufacturing an electrostatic chuck having good characteristics in heat dissipation, thermal shock resistance, and lightness. In one aspect, the method includes preparing a composite powder by ball-milling (i) aluminum or aluminum alloy powder and (ii) carbon-based nanomaterial powder. The method may also include preparing an electrode layer by sintering the composite powder through spark plasma sintering (SPS), and forming a dielectric layer on the electrode layer.

10 Claims, 1 Drawing Sheet

(51) Int. Cl.
  *B22F 3/24* (2006.01)
  *B22F 9/04* (2006.01)
  *C23C 4/11* (2016.01)
  *C22C 38/10* (2006.01)
  *C23C 4/134* (2016.01)
  *C01F 7/021* (2022.01)
  *B23Q 3/15* (2006.01)

(52) U.S. Cl.
  CPC ............... *B22F 9/04* (2013.01); *B23Q 3/15* (2013.01); *C01F 7/021* (2013.01); *C22C 38/105* (2013.01); *C23C 4/11* (2016.01); *C23C 4/134* (2016.01); *B22F 2003/1051* (2013.01); *B22F 2003/242* (2013.01); *B22F 2009/043* (2013.01); *B22F 2301/052* (2013.01); *B22F 2302/40* (2013.01)

(56) References Cited

U.S. PATENT DOCUMENTS

| | | | | |
|---|---|---|---|---|
| 2013/0059074 A1* | 3/2013 | Xu | .................. | B22F 1/16 |
| | | | | 427/213 |
| 2016/0336210 A1* | 11/2016 | Cooke | .............. | H01L 21/67248 |
| 2018/0126456 A1* | 5/2018 | So | .................. | C22C 5/02 |
| 2019/0276915 A1* | 9/2019 | Kwon | .............. | C22C 1/05 |

FOREIGN PATENT DOCUMENTS

| | | |
|---|---|---|
| KR | 10-1999-0062932 A | 7/1999 |
| KR | 10-2012-0078270 A | 7/2012 |
| KR | 10-2014-0119904 A | 10/2014 |
| KR | 101769750 B1 * 8/2017 ............... C23C 4/11 |
| KR | 10-2018-005972 A | 1/2018 |
| KR | 10-1822073 B1 | 1/2018 |
| KR | 10-2096985 B1 | 4/2020 |
| KR | 10-2020-0046233 A | 5/2020 |
| KR | 10-2020-0121627 A | 10/2020 |

OTHER PUBLICATIONS

Office Action received in Korean Application No. KR 10-2021-0060214 dated Oct. 29, 2022.
Notice of Allowance received in Korean Application No. KR 10-2021-0060214 dated Oct. 29, 2023.
Office Action received in Korean Application No. KR 10-2021-0060215 dated Oct. 30, 2022.
Notice of Allowance received in Korean Application No. KR 10-2021-0060215 dated Apr. 5, 2023.

* cited by examiner

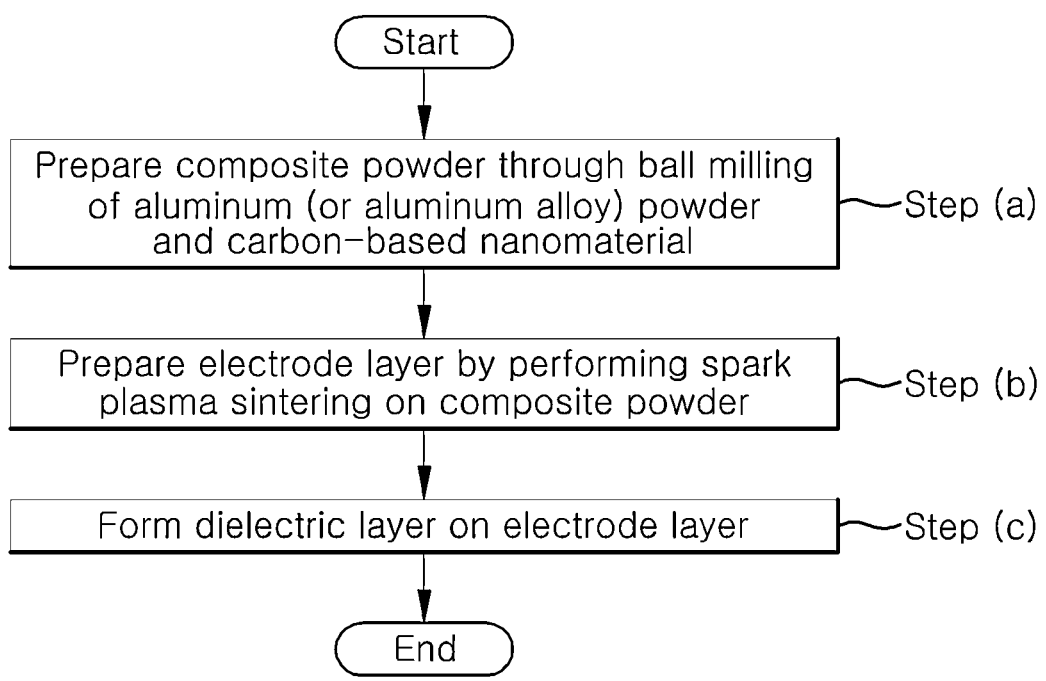

METHOD OF MANUFACTURING ELECTROSTATIC CHUCK HAVING ELECTRODE LAYER MADE OF HETEROGENEOUS COMPOSITE MATERIAL, AND ELECTROSTATIC CHUCK MANUFACTURED THEREBY

CROSS REFERENCE TO RELATED APPLICATION

The present application claims priority to Korean Patent Application No. 10-2021-0060215, filed May 10, 2021, the entire contents of which is incorporated herein for all purposes by this reference.

BACKGROUND

Technical Field

The present disclosure relates to a method of manufacturing an electrostatic chuck and to an electrostatic chuck manufactured by the method. More particularly, the present disclosure relates to a method of manufacturing an electrostatic chuck having excellent characteristics in heat dissipation, thermal shock resistance, and lightness due to the structure in which an electrode layer is made of a heterogeneous composite material and to an electrostatic check manufactured by the method.

Description of Related Technology

In the process of manufacturing semiconductor devices and display devices for which enlargement of substrates and higher integration of circuits are the main issues, a mechanical chuck or a vacuum chuck has been used to transport or fix a silicon wafer or a glass substrate.

The mechanical chuck has problems in that it has a complicated structure, requires time for maintenance and inspection, and suffers particle contamination due to the contact between a wafer and a clamp. In the case of a vacuum chuck, there is an inconvenience of creating a vacuum pressure leading to a weak adsorption force because the pressure difference cannot be sufficiently increased in the vacuum pressure condition. On the other hand, recently, electrostatic chucks (ESC) using electrostatic force have been widely used.

SUMMARY

An objective to be achieved by the present disclosure is to provide a method of manufacturing an electrostatic chuck having good durability even in a harsh environment where heating and cooling cycles are repeated, having a high heat dissipation property and high thermal shock resistance, and being lightweight, thereby being capable of dramatically improving the efficiency of production of semiconductor devices. Another objective is to provide an electrostatic chuck manufactured by the method.

In order to achieve the above technical objective, the present disclosure proposes a method of manufacturing an electrostatic chuck having good characteristics in heat dissipation, thermal shock resistance, and lightness, the method including: (a) preparing a composite powder by ball-milling (i) aluminum or aluminum alloy powder and (ii) carbon-based nanomaterial powder; (b) preparing an electrode layer by sintering the composite powder through spark plasma sintering (SPS); and (c) forming a dielectric layer on the electrode layer.

In addition, the present disclosure proposes a method of manufacturing an electrostatic chuck having a high heat dissipation property and high thermal shock resistance and being lightweight, in which the carbon-based nanomaterial may include at least one selected from the group consisting of carbon nanotubes, graphene, carbon nanofibers, carbon nanoparticles, mesoporous carbon, carbon nanosheets, carbon nanorods, and carbon nanobelts.

In addition, the present disclosure proposes a method of manufacturing an electrostatic chuck having good characteristics in heat dissipation, thermal shock resistance, and lightness, in which in step (b), the composite powder may undergo spark plasma sintering under a pressure of 30 MPa to 100 MPa, at a temperature of 350° C. to 650° C. for 1 second to 30 minutes to prepare the electrode layer.

In addition, the present disclosure proposes a method of manufacturing an electrostatic chuck having good characteristics in heat dissipation, thermal shock resistance, and lightness, in which in step (c), the dielectric layer may be made of $Al_2O_3$, $ZrO_2$, AlN, or $Y_2O_3$ and formed by thermal spraying.

In addition, the present disclosure proposes a method of manufacturing an electrostatic chuck having a high heat dissipation property and high thermal shock resistance and being lightweight, in which the thermal spraying may be air plasma spraying (APS), vacuum plasma spraying (VPS), or low pressure plasma spraying (LPPS).

In addition, the present disclosure proposes a method of manufacturing an electrostatic chuck having a high heat dissipation property and high thermal shock resistance and being lightweight, in which step (c) may include a step of forming a metal layer made of a metal alloy containing 1% to 5% by weight of cobalt (Co), 10% to 20% by weight of nickel (Ni), and 75% to 85% by weight of iron (Fe), prior to the formation of the dielectric layer on the electrode layer.

In another aspect of the present disclosure, there is provided an electrostatic chuck made by any one of the methods described above.

According to the present disclosure, it is possible to prepare a constituent member for an electrostatic chuck, for example, an electrode layer through a simpler process than the conventional process, thereby providing the advantage of obtaining both the equipment performance and the price competitiveness at the same time. The electrostatic chuck manufactured by the method of the present disclosure has good durability even in a harsh application condition in which heating and cooling are repeated and can dramatically improve the efficiency of the semiconductor production process.

BRIEF DESCRIPTION OF THE DRAWINGS

FIG. 1 is a process flowchart illustrating a method of manufacturing an electrostatic chuck including an electrode layer made of a heterogeneous composite material, according to the present disclosure.

DETAILED DESCRIPTION

Among metals used to manufacture the electrostatic chucks, aluminum or aluminum alloy is most common due to the advantage of relatively low manufacturing cost compared to sintered ceramic materials. However, when tunable electrostatic chucks (ESCs) are used at elevated temperatures higher than room temperature and undergo repeated heating and cooling cycles, these ESCs have a problem in that the thermal expansion coefficient thereof, which is the most important factor, is $10\times10^{-6}$ K$^{-1}$ or more which is very high compared to that of sintered ceramics or coatings.

Therefore, in the related art, due to the difference in the coefficient of thermal expansion between a base member made of metal and a ceramic dielectric layer formed on the base material, there was a problem in that the ceramic dielectric layer was peeled or cracked at the interface between the base member and the dielectric layer. This is because thermal stress occurs due to the difference in thermal expansion coefficient between the metal base member and the ceramic dielectric layer while heating and cooling are repeated.

Due to the peeling or cracking of the ceramic dielectric layer, the service life of the electrostatic chuck is shortened. This short service life of the electrostatic chuck results in frequent replacements to new electrostatic chucks, leading to an increase in the cost and an increase in time for the manufacturing process.

When the electrode of the electrostatic chuck is made of a material having higher thermal conductivity than the existing material for the electrostatic chuck, the semiconductor manufacturing speed can be increased due to rapid heat dissipation, which leads to the manufacture of semiconductors with high price competitiveness.

In describing the present disclosure, well-known functions or constructions will not be described in detail when it is determined that they may obscure the gist of the present disclosure.

Since embodiments in accordance with the concept of the present disclosure can undergo various changes and have various forms, only some specific embodiments are illustrated in the drawings and described in detail in the present specification. While specific embodiments of the present disclosure are described herein below, they are only for illustrative purposes and should not be construed as limiting to the present disclosure. So, the present disclosure should be construed to cover not only the specific embodiments but also cover all modifications, equivalents, and substitutions that fall within the concept and technical spirit of the present disclosure.

The terminology used herein is for the purpose of describing particular embodiments only and is not intended to limit the scope of the present disclosure. As used herein, the singular forms "a", "an", and "the" are intended to include the plural forms as well unless the context clearly indicates otherwise. It will be further understood that the terms "comprise" or "has" when used in the present specification specify the presence of stated features, regions, integers, steps, operations, elements and/or components, but do not preclude the presence or addition of one or more other features, regions, integers, steps, operations, elements, components and/or combinations thereof.

Hereinafter, embodiments of the present disclosure will be described in detail.

Referring to FIG. 1, a method of manufacturing an electrostatic chuck including an electrode layer made of a heterogeneous composite material includes: (a) preparing a composite powder by ball-milling (i) aluminum or aluminum alloy powder and (ii) carbon-based nanomaterial powder; (b) preparing an electrode layer by sintering the composite powder through spark plasma sintering (SPS); and (c) forming a dielectric layer on the electrode layer.

In step (a), the aluminum powder or aluminum alloy powder is the powder of any one selected from the group consisting of 1000 series, 2000 series, 3000 series, 4000 series, 5000 series, 6000 series, 7000 series, and 8000 series.

The carbon-based nanomaterial is at least one selected from the group consisting of carbon nanotubes, graphene, carbon nanofibers, carbon nanoparticles, mesoporous carbon, carbon nanosheets, carbon nanorods, and carbon nanobelts. The carbon-based nanomaterial may be added in an amount of 0.1% to 10% by volume with respect to the total volume of the composite powder.

Since the composite powder includes the carbon-based material such as carbon nanotubes, graphene, etc., the composite material manufactured from the billet including the same may have high thermal conductivity, high strength, and weight reduction characteristics.

Micro-sized aluminum alloy particles are difficult to disperse due to a large size difference from the nano-sized carbon-based nanomaterial, and the carbon-based nanomaterial easily agglomerates due to a strong Van der Waals force. Therefore, a dispersion agent is added to uniformly blend the carbon-based nanomaterial and the aluminum alloy powder.

As the dispersion agent, nanoparticles of a ceramic material selected from the group consisting of $SiC$, $SiO_2$, $Al_2O_3$, $TiO_2$, $Fe_3O_4$, $MgO$, $ZrO_2$, and various mixtures of these.

The nano-sized ceramic particles function to uniformly disperse the carbon-based material such as carbon nanotubes among the aluminum alloy particles. The nano-sized silicon carbide (SiC) particles have high tensile strength, high sharpness, constant electrical conductivity, constant thermal conductivity, high hardness, and high resistance to chemicals and thermal shock. Since the nano-sized SiC particles are highly stable at high temperatures and under chemicals, they are widely used as a material for an abrasive or a fireproofing material. In addition, the nano-sized SiC particles present on the surfaces of the aluminum alloy particles function to prevent direct contact between the carbon-based nanomaterial such as carbon nanotubes and the aluminum alloy particles, thereby inhibiting the formation of undesirable aluminum carbide which may be formed through a reaction between the carbon-based nanomaterial such as carbon nanotubes and the aluminum alloy particles.

In addition, the composite powder may include 100 parts by volume of the aluminum alloy powder and 0.01 to 10 parts by volume of the carbon-based nanomaterial.

When the content of the carbon-based nanomaterial is less than 0.01 part by volume per 100 parts by volume of the aluminum alloy powder, the strength of the composite material is similar to that of pure aluminum or aluminum alloy. In this case, the composite material cannot play a role as a reinforcing material. Conversely, when the content of the carbon-based nanomaterial exceeds 10 parts by volume, there is a disadvantage in that an elongation decreases although the strength of the composite material is higher than that of pure aluminum or aluminum alloy. In addition, when the content of the carbon nanotubes is extremely large, since the carbon nanotubes are difficult to disperse, mechanical and physical properties are degraded.

When the composite powder further includes the dispersion agent, the composite powder contains 0.1 to 10 parts by volume of the dispersion agent per 100 parts by volume of the aluminum alloy powder.

When the content of the dispersion agent is lower than 0.1 part by volume per 100 parts by volume of the aluminum alloy powder, the effect of improving dispersion is insignificant. Conversely, when the content exceeds 10 parts by volume, the dispersion agent rather causes the carbon-based nanomaterial to agglomerate, thereby hindering dispersion of the carbon-based nanomaterial.

The ball milling is performed in an air or inert gas ambient (for example, nitrogen or argon ambient) at a low speed of 150 to 300 rpm or a high speed of 300 or more rpm for a duration of 12 to 48 hours, using a ball mill. For example, a horizontal ball mill or a planetary ball mill is used for the ball milling.

The ball milling begins by charging 100 to 1500 parts by volume of stainless steel balls (a 1:1 mixture of balls with a diameter of 10 mm and balls with a diameter of 20 mm) into a stainless steel container with respect to 100 parts by volume of the composite powder.

To reduce the coefficient of friction, any one organic solvent selected from the group consisting of heptane, hexane, and alcohol is used as a process control agent. In this case, the process control agent is added in an amount of 10 to 50 parts by volume per 100 parts by volume of the composite powder. After the completion of the ball milling, the ball mill container is opened so that the organic solvent can volatilize when the powder mixture is collected. Thus, only the aluminum alloy powder and the carbon nanotubes remain in the powder mixture.

The nano-zed ceramic particles serving as the dispersion agent also play the same role as nano-sized milling balls due to the rotational force generated during the ball milling, thereby physically separating the agglomerated carbon-based nanomaterial and improving the fluidity of the carbon-based nanomaterial. Thus, the carbon-based nanomaterial can be uniformly dispersed on the surfaces of the aluminum particles.

On the other hand, step (a) may further include a step of preparing a molded article from the mixed powder prior to the spark plasma sintering (SPS) to be described later. As a method of preparing the molded body, any conventional molding method using powder to produce a molded body can be used without limitations. For example, a method of manufacturing a preliminary molded body by supplying a mixed powder to a mold may be used.

More specifically, the preliminary molded body may be prepared by charging the mixed powder into a mold provided in a chamber of a spark plasma sintering apparatus. The mold may take an arbitrary shape. For example, the mold may be in the form of a rod or a plate. The mold may be made of a material stable even at high temperature so that the mold cannot act as an impurity source in a spark plasma sintering process to be described later.

Next, in step (b), the mixed powder prepared in step (a) is sintered by spark plasma sintering (SPS) to prepare a heterogeneous composite material of the aluminum (or aluminum alloy)/carbon-based nanomaterial (CNT, graphene, etc.), and the sintered body is processed to form the electrode layer.

In the spark plasma sintering, a DC current is applied to the mixed powder under pressure so that a spark discharge phenomenon occurs due to a pulsed DC current flowing between the particles of the mixed powder, whereby the mixed powder is sintered due to heat diffusion and electric field diffusion caused by the high energy of the generated spark plasma, the generation of heat caused by electric resistance of the mold, and the pressure and electric energy that are applied. The sintering makes the aluminum (or aluminum alloy) and the carbon-based nanomaterial to combine in a short time, thereby forming a composite material having high density. Through this sintering, the growth of the particles of the composite material can be effectively controlled. Therefore, it is possible to prepare an aluminum (or aluminum alloy)/carbon-based nanomaterial heterogeneous composite material sintered body having a uniform microstructure.

In the present disclosure, the spark plasma sintering process may be performed using a spark plasma sintering apparatus including: a chamber accommodating a mold in which a mixed powder is to be sintered when spark plasma is generated between an upper electrode and a lower electrode to which an electric current is applied; a cooling unit configured to cool the chamber by circulating cooling water; a current supply unit configured to apply the electric current across the upper electrode and the lower electrode; a temperature detector configured to detect a temperature of the chamber; a pump configured to discharge air from an inner space of the chamber to the outside of the apparatus; a pressure adjusting unit configured to adjust an internal pressure of the chamber; a controller configured to adaptively control a spark plasma sintering process temperature according to the temperature detected by the temperature detector; and a manipulation unit used to operate the controller.

In this step, in order to sinter the mixed powder through the discharge plasma sintering, the inside of the chamber may be purged by the pump of the spark plasma sintering apparatus so that the internal pressure of the chamber is reduced to a vacuum pressure, whereby gas-phase impurities in the chamber are removed, and oxidation is prevented in the chamber.

In addition, after preheating the mixed powder by heating the mixed powder to the sintering temperature at a temperature increase rate of 100° C./minute, the spark plasma sintering may be performed. Through the preheating of the mixed powder at the described temperature increase rate, the inner and outer portions of the mixed powder are uniformly heated, resulting in an aluminum (or aluminum alloy)/carbon-based nanomaterial heterogeneous composite material sintered body having a uniform structure.

The above-described spark plasma sintering process is preferably performed for 1 second to 30 minutes at a temperature of 350° C. to 650° C. at a pressure of 30 to 100 MPa, so that the heterogeneous composite material sintered body of the aluminum (or aluminum alloy)/carbon-based nanomaterials (CNTs, graphene, etc.) can be manufactured.

Next, in step (c), the dielectric layer is formed on the electrode layer to manufacture an electrostatic chuck having a structure in which the electrode layer and the dielectric layer are stacked in order.

As a specific method of forming the dielectric layer on the electrode layer in this step, a conventional coating layer forming method such as physical vapor deposition (PVD) and chemical vapor deposition (CVD) may be used. However, in terms of the productivity of the dielectric layer and stability, this step is preferably performed by thermal spraying.

More preferably, plasma spraying that uses plasma as a heat source may be used to melt, accelerate, and coat dielectric material powder. Specific examples thereof include air plasma spraying (APS), vacuum plasma spraying (VPS), low pressure plasma spraying (LPPS), etc.

In addition, prior to the formation of the dielectric layer on the electrode layer, a step of forming a metal layer made of metal alloy including 1% to 5% by weight of cobalt (Co), 10% to 20% by weight of nickel (Ni), and 75% to 85% by weight of iron (Fe) may be performed.

The alloy having the composition described above has a little difference in coefficient of thermal expansion from the material constituting the dielectric layer. Therefore, even though the electrostatic chuck is used in a semiconductor manufacturing apparatus in which heating and cooling are repeated, the dielectric breakdown attributable to thermal shock is reduced. Since the alloy has good thermal resistance, it is possible to obtain an electrostatic chuck exhibiting excellent insulation properties and reliability.

As a method of forming the dielectric layer on the electrode layer, a conventional coating layer forming method such as physical vapor deposition (PVD) or chemical vapor deposition (CVD) may be used. However, in terms of the productivity and stability, thermal spraying may be preferably used.

More preferably, plasma spraying that uses plasma as a heat source may be used to melt, accelerate, and coat dielectric material powder. Specific examples thereof include air plasma spraying (APS), vacuum plasma spraying (VPS), low pressure plasma spraying (LPPS), etc.

On the other hand, surface treatment may be performed on the electrode layer to improve the bonding force between the electrode layer and the dielectric layer through a known surface treatment method, if necessary, before the step of forming the dielectric layer. For example, when the dielectric layer is formed by thermal spraying, the surface of the electrode layer may be roughened by blasting so that the bonding force between the electrode layer and the dielectric layer can be improved.

With the use of the electrostatic chuck manufacturing method of the present disclosure, it is possible to prepare a constituent member for an electrostatic chuck, for example, an electrode layer through a simpler process than the conventional process, thereby providing the advantage of obtaining both the equipment performance and the price competitiveness at the same time. The electrostatic chuck manufactured by the method of the present disclosure has good durability even in a harsh application condition in which heating and cooling are repeated and can dramatically improve the efficiency of the semiconductor production process.

Hereinafter, the embodiments of the present disclosure will be described in more detail by way of examples.

Examples disclosed in the present disclosure can be modified into various other forms, and the scope of the present disclosure is not construed as being limited to the examples described below. Examples are provided to more fully describe the present disclosure to the ordinarily skilled in the art.

Example 1

Carbon nanotubes (manufactured by OCSiAl headquartered in Luxembourg) having a purity of 99.5%, a diameter of 10 nm or less, and a length of 30 µm or less were used. Aluminum powder (manufactured by MetalPlayer headquartered in Korea) having an average particle size of 45 µm and a purity of 99.8% was used.

First, 99.5% by volume of the aluminum powder and 0.5% by volume of the carbon nanotubes were introduced into a stainless steel container to fill 30% of the total volume of the stainless steel container. Stainless steel balls (a mixture of balls having a diameter of 20 mm and balls having a diameter of 10 mm) were introduced into the container by 30% of the total volume of the container, and 50 mL of heptane was added to the content in the stainless steel container. The mixture was ball-milled at a low speed of 160 rpm for 24 hours in a horizontal ball mill. Next, the container was opened to allow the heptane to completely volatilize, and the remaining aluminum-CNT composite powder was collected.

The prepared composite powder was charged into a graphite mold, and the mold was mounted in a chamber of a spark plasma sintering apparatus. The internal pressure of the chamber is adjusted to enter a vacuum state, and an electric current is applied across upper and lower electrodes to perform a spark plasma sintering process for 5 minutes at a temperature of 600° C. at a pressure of 50 MPa. This sintering process produces a sintered body made of an aluminum-carbon nanotube composite material (Al-0.5 vol % CNT). An electrode layer was prepared by processing the sintered body into a circular form.

The surface of the electrode layer was then threated by blasting, and a dielectric layer having a thickness of 110 µm was formed on the entire blast-treated surface of the electrode layer by air plasma spraying (APS) using $Al_2O_3$ powder.

Example 2

An electrostatic chuck was prepared in the same manner as in Example 1 except that an aluminum-CNT composite powder containing 99.0% by volume of aluminum powder and 1.0% by volume of carbon nanotubes was sintered by spark plasma sintering to prepare a sintered body of a composite material (Al-1.0 vol % CNT).

Example 3

An electrostatic chuck was prepared in the same manner as in Example 1 except that an aluminum-CNT composite powder containing 97.0% by volume of aluminum powder and 3.0% by volume of carbon nanotubes was sintered by spark plasma sintering to prepare a sintered body of a composite material (Al-3.0 vol % CNT).

Example 4

An electrostatic chuck was prepared in the same manner as in Example 1 except that an aluminum-CNT composite powder containing 95.0% by volume of aluminum powder and 5.0% by volume of carbon nanotubes was sintered by spark plasma sintering to prepare a sintered body of a composite material (Al-5.0 vol % CNT).

Example 5

An electrostatic chuck was prepared in the same manner as in Example 1 except that an aluminum-graphene composite powder containing 99.5% by volume of aluminum powder and 0.5% by volume of graphene was sintered by spark plasma sintering to prepare a sintered body of a composite material (Al-0.5 vol % Graphene).

Example 6

An electrostatic chuck was prepared in the same manner as in Example 1 except that an aluminum-graphene composite powder containing 99.0% by volume of aluminum powder and 1.0% by volume of graphene was sintered by spark plasma sintering to prepare a sintered body of a composite material (Al-1.0 vol % Graphene).

Example 7

An electrostatic chuck was prepared in the same manner as in Example 1 except that an aluminum-graphene composite powder containing 97.0% by volume of aluminum powder and 3.0% by volume of graphene was sintered by spark plasma sintering to prepare a sintered body of a composite material (Al-3.0 vol % Graphene).

Example 8

An electrostatic chuck was prepared in the same manner as in Example 1 except that an aluminum-graphene composite powder containing 95.0% by volume of aluminum powder and 5.0% by volume of graphene was sintered by spark plasma sintering to prepare a sintered body of a composite material (Al-5.0 vol % Graphene).

Example 9

An electrostatic chuck was prepared in the same manner as in Example 1 except that an aluminum-CNT-graphene composite powder containing 99.5% by volume of aluminum powder, 0.25% by volume of carbon nanotubes, and 0.25% by volume of graphene was sintered by spark plasma sintering to prepare a sintered body of a composite material (Al-0.25 vol % CNT-0.25 vol % Graphene).

Example 10

An electrostatic chuck was prepared in the same manner as in Example 1 except that an aluminum-CNT-graphene composite powder containing 90% by volume of aluminum powder, 0.5% by volume of carbon nanotubes, and 0.5% by volume of graphene was sintered by spark plasma sintering to prepare a sintered body of a composite material (Al-0.5 vol % CNT-0.5 vol % Graphene).

Example 11

An electrostatic chuck was prepared in the same manner as in Example 1 except that an aluminum-CNT-graphene composite powder containing 97% by volume of aluminum powder, 1.5% by volume of carbon nanotubes, and 1.5% by volume of graphene was sintered by spark plasma sintering to prepare a sintered body of a composite material (Al-1.5 vol % CNT-1.5 vol % Graphene).

Example 12

An electrostatic chuck was prepared in the same manner as in Example 1 except that an aluminum-CNT-graphene composite powder containing 95% by volume of aluminum powder, 2.5% by volume of carbon nanotubes, and 2.5% by volume of graphene was sintered by spark plasma sintering to prepare a sintered body of a composite material (Al-2.5 vol % CNT-2.5 vol % Graphene).

The sintered body of the aluminum alloy-CNT composite material prepared as a material for an electrode layer in each of Examples 1 to 12 exhibits a maximum thermal conductivity of 260 W/m-K which is dramatically higher than that of pure aluminum, which is a conventional material for an electrode layer of an electrostatic chuck. In addition, the tensile strength of the sintered body prepared in each of Examples 1 to 12 was improved by 200% compared to the pure aluminum electrode layer, and the coefficient of thermal expansion of the sintered member was $17 \times 10^{-6}$ $K^{-1}$, which was significantly reduced compared to pure aluminum.

While exemplary embodiments of the present disclosure have been described with reference to the accompanying drawings, those skilled in the art will appreciate that the present disclosure can be implemented in other different forms without departing from the technical spirit or essential characteristics of the exemplary embodiments. Therefore, it can be understood that the exemplary embodiments described above are only for illustrative purposes and are not restrictive in all aspects.

What is claimed is:

1. A method of manufacturing an electrostatic chuck, the method comprising:
   preparing a powdered composite material by ball-milling (i) aluminum or aluminum alloy powder and (ii) carbon-based nanomaterial powder;
   preparing an electrode layer by subjecting the powdered composite material to spark plasma sintering (SPS);
   forming a metal layer at least partially over the electrode layer, the metal layer comprising 1% to 5% by weight of cobalt (Co), 10% to 20% by weight of nickel (Ni), and 75% to 85% by weight of iron (Fe); and
   forming a dielectric layer at least partially over the electrode layer and the metal layer.

2. The method according to claim 1, wherein the carbon-based nanomaterial powder is at least one selected from the group consisting of carbon nanotubes, graphene, carbon nanofibers, carbon nanoparticles, mesoporous carbon, carbon nanosheets, carbon nanorods, and carbon nanobelts.

3. The method according to claim 1, wherein, in preparing the electrode layer, the powdered composite material undergoes spark plasma sintering under a pressure of 30 MPa to 100 MPa at a temperature of 350° C. to 650° C. for 1 second to 30 minutes to prepare the electrode layer.

4. The method according to claim 1, wherein, in forming the dielectric layer, the dielectric layer is made of $Al_2O_3$, $ZrO_3$, AlN, or $Y_2O_3$ and formed by thermal spraying.

5. The method according to claim 4, wherein the thermal spraying is air plasma spraying (APS), vacuum plasma spraying (VPS), or low pressure plasma spraying (LPPS).

6. The method according to claim 1, wherein a thermal conductivity of the electrode layer is greater than that of a pure aluminum and smaller than 260 W/m-K.

7. The method according to claim 1, wherein a tensile strength of the electrode layer is greater than that of a pure aluminum.

8. The method according to claim 7, wherein the tensile strength of the electrode layer is at least 300% greater than that of the pure aluminum.

9. The method according to claim 1, wherein a coefficient of thermal expansion of the electrode layer is smaller than that of a pure aluminum.

10. The method according to claim 9, wherein the coefficient of thermal expansion of the electrode layer is $17 \times 10^{-6}$ $K^{-1}$.

* * * * *